(12) United States Patent
Snyman et al.

(10) Patent No.: US 8,759,845 B2
(45) Date of Patent: Jun. 24, 2014

(54) SEMICONDUCTOR LIGHT EMITTING DEVICE UTILISING PUNCH-THROUGH EFFECTS

(75) Inventors: Lukas Willem Snyman, Pretoria (ZA); Monuko Du Plessis, Pretoria (ZA)

(73) Assignee: Insiava (Pty) Limited, Pretoria (ZA)

( * ) Notice: Subject to any disclaimer, the term of this patent is extended or adjusted under 35 U.S.C. 154(b) by 431 days.

(21) Appl. No.: 12/863,743

(22) PCT Filed: Jan. 21, 2009

(86) PCT No.: PCT/IB2009/050209
§ 371 (c)(1), (2), (4) Date: Oct. 18, 2010

(87) PCT Pub. No.: WO2009/093177
PCT Pub. Date: Jul. 30, 2009

(65) Prior Publication Data
US 2011/0031893 A1 Feb. 10, 2011

(30) Foreign Application Priority Data
Jan. 21, 2008 (ZA) ................. 2008/00593

(51) Int. Cl.
*H01L 27/15* (2006.01)
*H01L 29/167* (2006.01)
*H01L 31/12* (2006.01)
*H01L 33/00* (2010.01)

(52) U.S. Cl.
USPC .......... 257/86; 257/87; 257/E33.053; 438/22; 315/291

(58) Field of Classification Search
None
See application file for complete search history.

(56) References Cited

U.S. PATENT DOCUMENTS 5,136,353 A * 8/1992 Pankove et al. ......... 250/214 SW
5,510,627 A * 4/1996 Snow ........................ 257/21

(Continued)

FOREIGN PATENT DOCUMENTS

EP 0 276 140 7/1988
JP 60-167390 8/1985

(Continued)

OTHER PUBLICATIONS

Corrected Version of International Preliminary Report on Patentability for PCT/IB2009/050209, completed May 3, 2010. (stamp receipt date Jul. 21, 2010).

(Continued)

*Primary Examiner* — W. Wendy Kuo
*Assistant Examiner* — Shaka White
(74) *Attorney, Agent, or Firm* — Nixon & Vanderhye PC

(57) ABSTRACT

A light emitting device (10) comprises a body (12) of a semiconductor material. A first junction region (14) is formed in the body between a first region (12.1) of the body of a first doping kind and a second region (12.2) of the body of a second doping kind. A second junction region (16) is formed in the body between the second region (12.2) of the body and a third region (12.3) of the body of the first doping kind. A terminal arrangement (18) is connected to the body for, in use, reverse biasing the first junction region (14) into a breakdown mode and for forward biasing at least part (16.1) of the second junction region (16), to inject carriers towards the first junction region (14). The device (10) is configured so that a first depletion region (20) associated with the reverse biased first junction region (14) punches through to a second depletion region associated with the forward biased second junction region (16).

11 Claims, 7 Drawing Sheets

(56) References Cited

U.S. PATENT DOCUMENTS

| | | | |
|---|---|---|---|
| 5,994,720 | A | 11/1999 | Snyman et al. |
| 6,111,271 | A * | 8/2000 | Snyman et al. ............... 257/80 |
| 6,365,911 | B1 | 4/2002 | Furuyama |
| 8,362,679 | B2 | 1/2013 | Du Plessis |
| 8,395,226 | B2 | 3/2013 | Du Plessis et al. |
| 2011/0042701 | A1 | 2/2011 | Du Plessis et al. |
| 2011/0068716 | A1 | 3/2011 | Snyman et al. |
| 2012/0001681 | A1 | 1/2012 | Du Plessis |
| 2012/0009709 | A1 | 1/2012 | Du Plessis |
| 2013/0026534 | A1 | 1/2013 | Venter |

FOREIGN PATENT DOCUMENTS

| | | |
|---|---|---|
| WO | 2005/020287 | 3/2005 |
| WO | 2009/047716 | 4/2009 |

OTHER PUBLICATIONS

Snyman et al., "Injection-avalanche-based n<+>pn Silicon Complementary Metal-Oxide-Semiconductor light-emitting device (450-750 nm) with 2-order-of-magnitude Increase in Light Emission Intensity", Japanese Journal of Applied Physics, Part 1 (Regular Papers, Short Notes & Review Papers) Japan Society of Applied Physics Through the Institute of Pure and Applied Physics Japan, vol. 46, No. 48, Apr. 2007, pp. 2474-2480, XP002527051.

Du Plessis et al., "Two- and Multi-terminal CMOS/BiCMOS LED's", Publishers B.V. Amsterdam, NL vol. 27, No. 5, Feb. 1, 2005, pp. 1059-1063, XP025328182.

Snyman at al., "Increasing the Efficiency of p <+>np<+> Injection-avalanche Si CMOS LED's (450 nm-750 nm) by means of Depletion Layer Profiling and Reach-through Techniques", Proceedings of SPIE Silicon Photonics III, vol. 6898, Feb. 7, 2008, pp. 68980E-1-68980E-12, XP002527052.

U.S. Appl. No. 13/810,809 (Du Plessis et al.) filed Apr. 1, 2013.
U.S. Appl. No. 13/574,333 (Venter, Petrus Johannes) filed Jul. 20, 2012.
U.S. Appl. No. 13/161,113 (Du Plessis) filed Jun. 15, 2011.
U.S. Appl. No. 13/139,653 (Du Plessis) filed Jun. 14, 2011.
U.S. Appl. No. 12/865,609 (Snyman et al.) filed Jul. 30, 2010 (now allowed).
U.S. Appl. No. 12/740,597 (Du Plessis et al.) filed Oct. 20, 2010.

* cited by examiner

SEMICONDUCTOR LIGHT EMITTING DEVICE UTILISING PUNCH-THROUGH EFFECTS

This application is the U.S. national phase of International Application No. PCT/IB2009/050209, filed 21 Jan. 2009, which designated the U.S. and claims priority to South African Application No. 2008/00593 filed 21 Jan. 2008, the entire contents of each of which are hereby incorporated by reference.

INTRODUCTION AND BACKGROUND

This invention relates to optoelectronic devices and more particularly to a light emitting device fabricated from a semiconductor material and to a method of generating light in a semiconductor material.

Avalanche electroluminescent light emission in single crystal indirect bandgap semiconductors (e.g. silicon) is generated by the interaction between mobile carriers (e.g. recombination of electrons and holes) and lattice phonons in a reverse biased pn junction. The internal quantum efficiency (number of photons generated per electron) can be enhanced if "cool" (low energy) carriers are injected into the reverse biased junction from a closely spaced forward biased junction to interact with the "hot" energetic carriers within the depletion region.

However, in conventional devices, the carriers injected from the forward biased junction will be injected across all of the forward biased junction area (sidewalls and bottom wall). This means that only a relatively small percentage of all the injected carriers reach the reverse biased depletion region, to initiate light generation. The carriers not reaching the reverse biased avalanching depletion are lost and represent device current not being utilized for light generation, thus reducing the power efficiency of the light source.

OBJECT OF THE INVENTION

Accordingly, it is an object of the present invention to provide an alternative light emitting device and associated method with which the applicant believes the aforementioned disadvantages may at least be alleviated.

SUMMARY OF THE INVENTION

According to the invention there is provided a light emitting device comprising;
a body of a semiconductor;
a first junction region in the body formed between a first region of the body of a first doping kind and a second region of the body of a second doping kind;
a second junction region in the body formed between the second region of the body and a third region of the body of the first doping kind;
a terminal arrangement connected to the body for, in use, reverse biasing the first junction region into a breakdown mode and for forward biasing at least part of the second junction region, to inject carriers towards the first junction region; and
the device being configured so that a first depletion region associated with the reverse biased first junction region punches through the second region to a second depletion region associated with the forward biased at least part of the second junction region.

The semiconductor material may be an indirect bandgap material. Alternatively it may be a direct bandgap material.

The breakthrough mode may be an avalanche mode, alternatively a field emission mode, further alternatively a combination of avalanche and field emission.

In some embodiments the first doping kind may be n and the second doping kind may be p. In other embodiments the first doping kind may be p and the second doping kind may be n.

In some embodiments the first depletion region may punch through to the second junction region.

The terminal arrangement may comprise two terminals, a first terminal connected to the first region of the body, to apply a voltage of a first polarity to the first region; and a second terminal connected to the third region of the body, to apply a voltage of an opposite polarity to the third region.

Alternatively, the terminal arrangement may comprise three terminals, a first terminal connected to the first region of the body; a second terminal connected to the third region of the body; and a third terminal connected to the second region of the body. A modulation signal may be applied to the third terminal. Hence, the first and second terminals may be used for controlling electroluminescence processes, carrier energies and carrier density profiles; and the third terminal may be used for controlling the modulation of the output electroluminescence of the device.

The invention further includes in its scope a method of operating a light emitting device comprising the steps of:
utilizing a body of a semiconductor material;
causing a first junction region to be formed between a first region of the body of a first doping kind and a second region of the body of a second doping kind and a second junction region to be formed in the body between the second region of the body and a third region of the body of the first doping kind;
reverse biasing the first junction region into a breakdown mode;
causing at least part of the second junction region to be forward biased, to inject carriers towards the first junction region; and
causing a first depletion region associated with the reverse biased first junction region to punch through the second region of the body to a second depletion region associated with the forward biased second junction region.

The second junction may be slightly reverse biased and the first part of the second junction region may be caused to be forward biased by the punched through first depletion region.

BRIEF DESCRIPTION OF THE ACCOMPANYING DIAGRAMS

The invention will now further be described, by way of example only, with reference to the accompanying diagrams wherein.

DESCRIPTION OF A PREFERRED EMBODIMENT OF THE INVENTION

Figure 1:
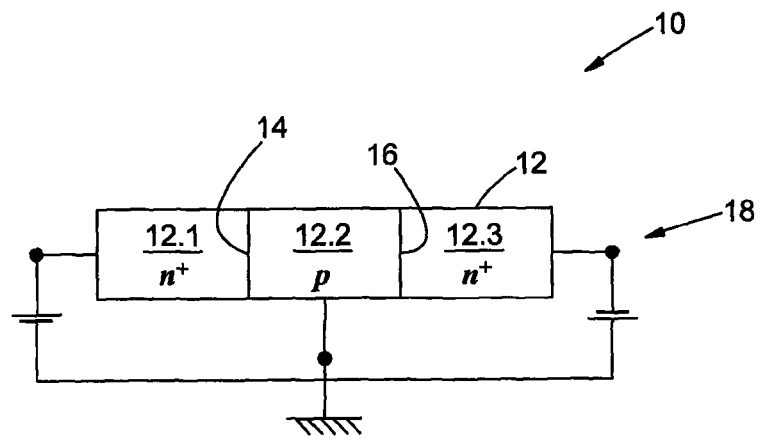
FIG. 1 is a diagrammatic representation of a silicon light emitting device.

A multi-terminal light emitting device fabricated from a semiconductor material is generally designated by the reference numeral 10 in FIG. 1. The material may be an indirect bandgap semiconductor material, such as Si, Ge and Si—Ge. In other embodiments, a direct bandgap material may be used.

In the embodiment shown, the device 10 comprises a body 12 of an indirect bandgap semiconductor material, in this case Si. The body comprises a first junction region 14 between a first region 12.1 of the body of a first doping kind and a second region 12.2 of the first body of a second doping kind. The first body further comprises a second junction region 16 between the second region 12.2 and a third region 12.3 of the body, also of the first doping kind. The first doping kind may be n+ and the second doping kind may be p. In other embodiments opposite doping kinds may be used. A terminal arrangement 18 is connected to the body for, in use, reverse biasing the first junction region 14 into a breakdown mode and for forward biasing at least part of the second junction region 16, to inject carriers towards the first junction region. The breakdown mode may be an avalanche mode, alternatively a field emission mode, further alternatively a combination of avalanche and field emission.

Figure 5:
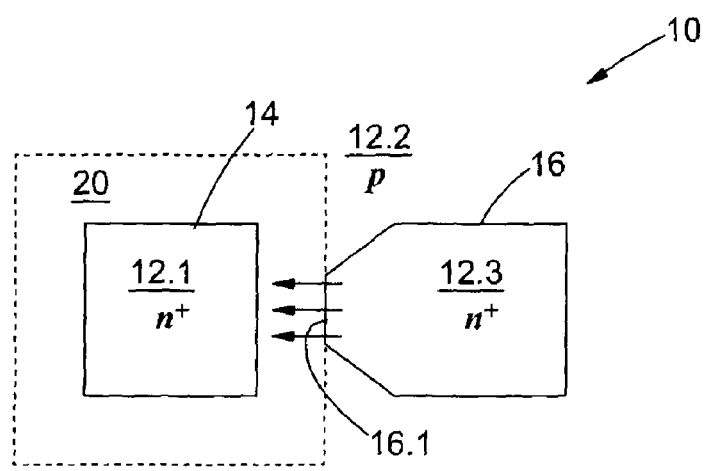
FIG. 5 is a diagram similar to FIG. 2 for the device in accordance with the invention.

Referring now also to FIG. 5, the device 10 is configured so that a first depletion region 20 associated with the reverse biased first junction region 14 punches through to a second depletion region associated with the forward biased second junction region 16. In the embodiment shown in FIG. 5, the first depletion region 20 punches through to at least first part 16.1 of the second junction region 16.

Figure 2:
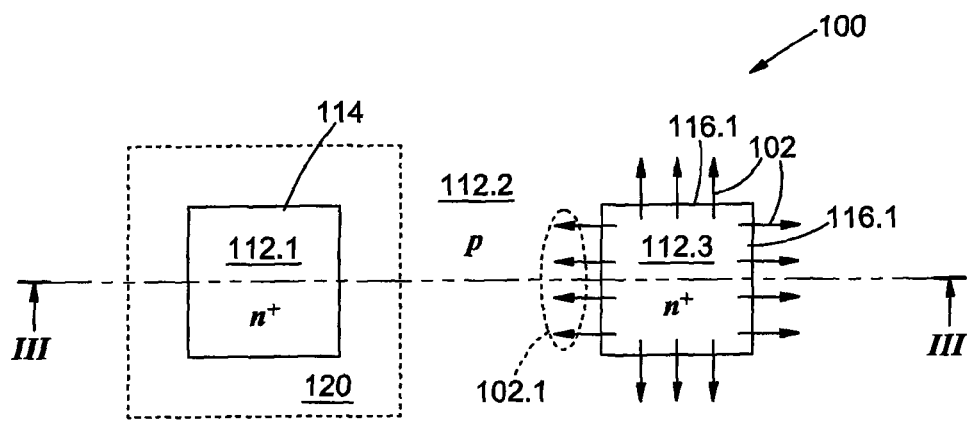
FIG. 2 is a schematic diagram of the layout in plan of a conventional silicon carrier injection light emitting device.
Figure 3:
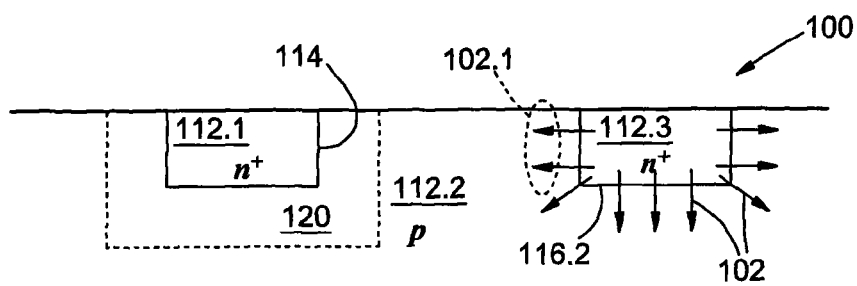
FIG. 3 is a schematic section on line III in FIG. 2.

Referring to FIGS. 2 and 3, in conventional devices 100, carriers 102 injected into the p-type material 112.2 will be injected across all of the forward biased junction region 116, including the sidewalls 116.1 and bottom wall 116.2 thereof. This means that only a relatively small percentage 102.1 of all the injected carriers 102 reach the reverse biased depletion region 120 to initiate light generation. The carriers not reaching the reverse biased avalanching depletion will be lost and represent device current not being utilized for light generation, thus reducing the power efficiency of the light source.

On the other hand, it is believed that with a punch through structure, such as that shown in of FIG. 5, the percentage of injected carriers reaching the avalanching reverse biased junction 14 is increased.

Figure 4:
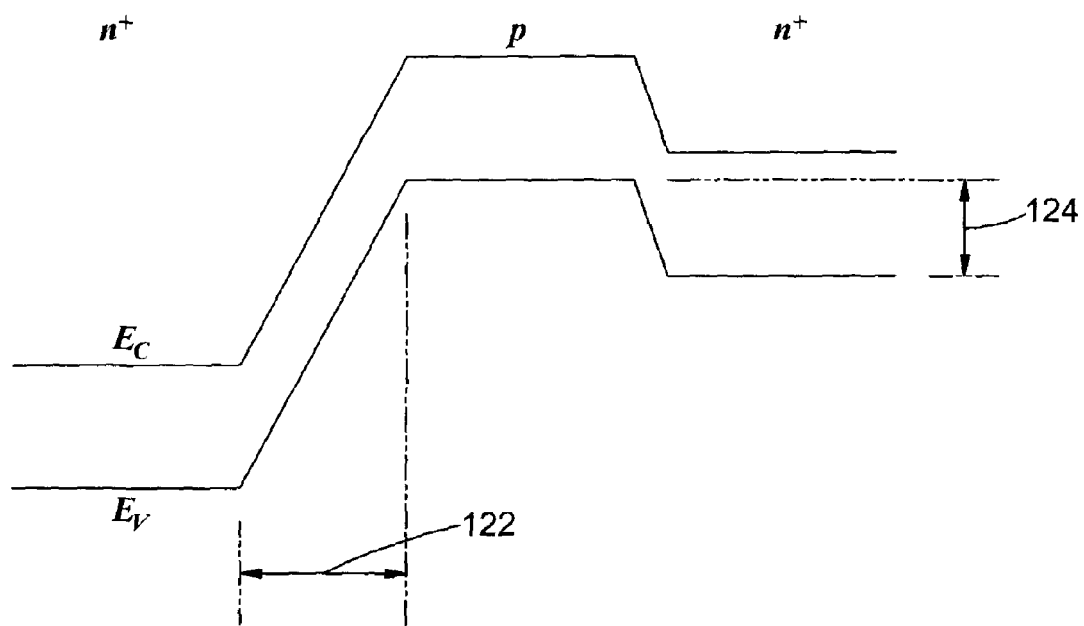
FIG. 4 is a energy band diagram for the conventional device in FIGS. 2 and 3.

The energy diagram shown in FIG. 4 presents the energy barriers of the two junctions 114 and 116 in a conventional device 100 as shown in FIGS. 2 and 3. The barrier of the reverse biased junction 114 is increased from the equilibrium condition, while the barriers of the forward biased junction 116 is reduced compared to the equilibrium (zero volt bias) condition. The width of depletion region 120 of the reversed bias junction 114 is indicated at 122 and the energy barrier of the forward biased junction 116 is indicated at 124 in FIG. 4.

Referring now again to FIG. 5, it is believed that if the depletion region 20 of the reverse biased junction 14 can be made to reach the depletion region of the forward biased junction 16, the electrostatic influence of the reverse biased junction 14 will lower the energy barrier (shown at 24 in FIG. 6) at the forward biased junction 16 locally at 16.1, only where the depletion regions meet, compared to that of the conventional device as shown at 124 in FIG. 4.

Figure 6:
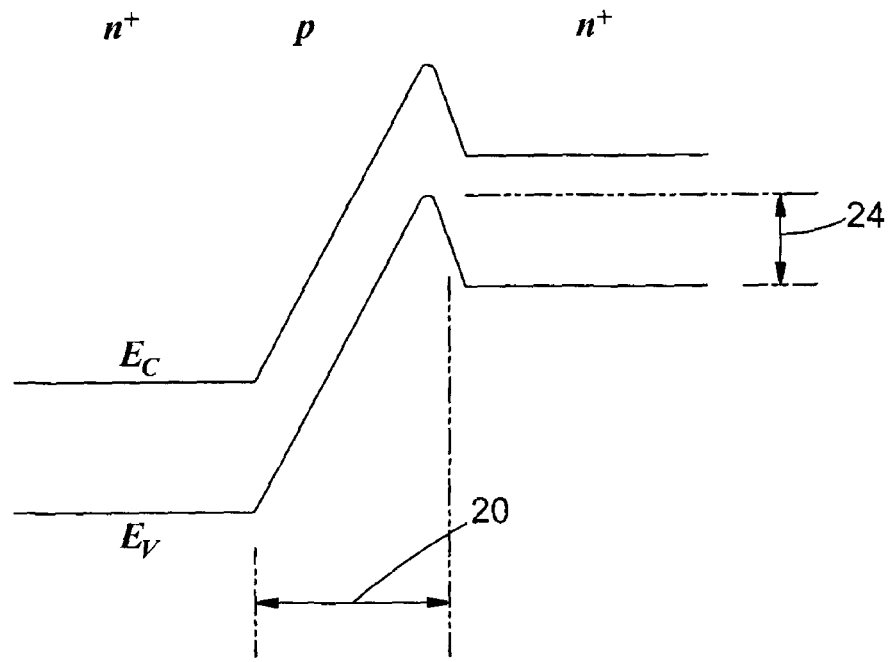
FIG. 6 is an energy band diagram for the carrier injection device in accordance with the invention.

As shown in FIG. 6, the energy barrier 24 at the forward biased junction is even further lowered by the encroaching depletion region 20 from the reverse biased junction 14. This effect is commonly known as punch through, normally seen as a negative parasitic effect, but in this case the effect is used in a positive way to enhance avalanche electroluminescence effects.

The punch through effect can be localised as shown at 16.1 in FIG. 5. In the device in FIG. 5, the reverse biased junction depletion region 20 punches through to the laterally spaced nearby junction 16 in a localized, well defined, part or interface 16.1. The nearby junction energy barrier 24 is lowered locally at the intersection interface 16.1, causing that part 16.1 of the junction 16 to be more forward biased than the rest of the junction area. In practice, the nearby junction 16 can in fact be slightly reverse biased to stop carrier injection entirely across all of the nearby junction area. In this case, the punch through interface 16.1 will be the only part of the nearby junction being forward biased by the energy barrier lowering effect, causing exclusive carrier injection into the reverse biased junction depletion region. it is believed that by using the device in this mode, there may be less losses as a result of carrier injection into the bulk not reaching the reverse biased depletion region, and it is further believed that electroluminescence efficiency may be improved.

Figure 7:
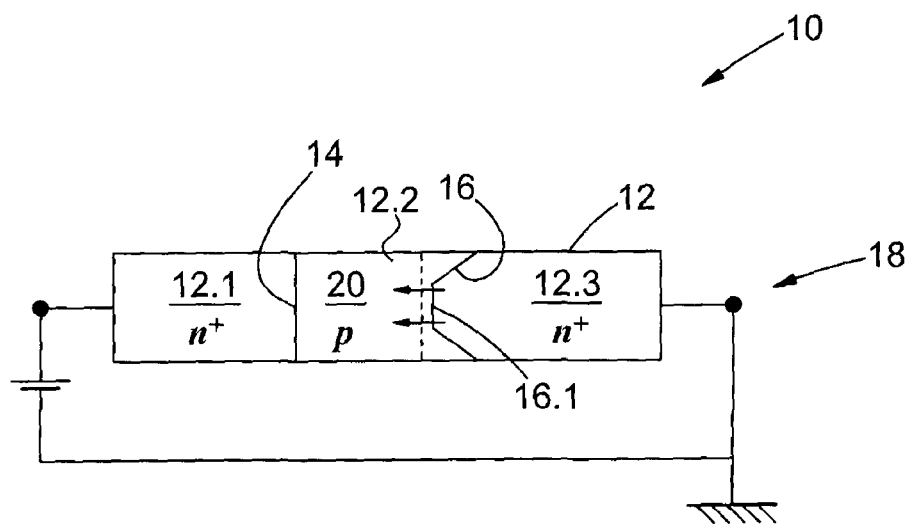
FIG. 7 is a diagrammatic representation of a two terminal device in accordance with the invention.

As shown in FIG. 7, the carrier injection punch through device 10 in accordance with the invention, may also be operated as a two terminal device. In this mode of operation, the p-type bulk contact of the terminal arrangement 18 is not necessary.

The advantage of using carrier injection into the avalanching junction can be demonstrated by investigating the carrier concentration profiles in the depletion region for a conventional n+p junction, compared to the punch through n+pn+ structure.

Figure 8:
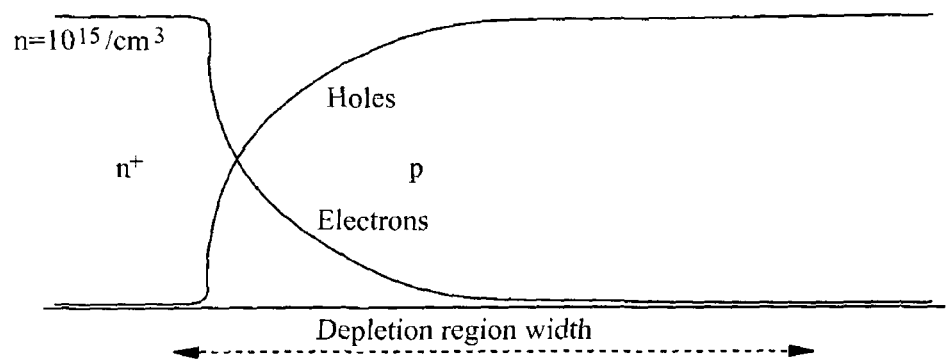
FIG. 8 is a diagram of carrier concentration profiles in a conventional $n^+p$ diode.
Figure 9:
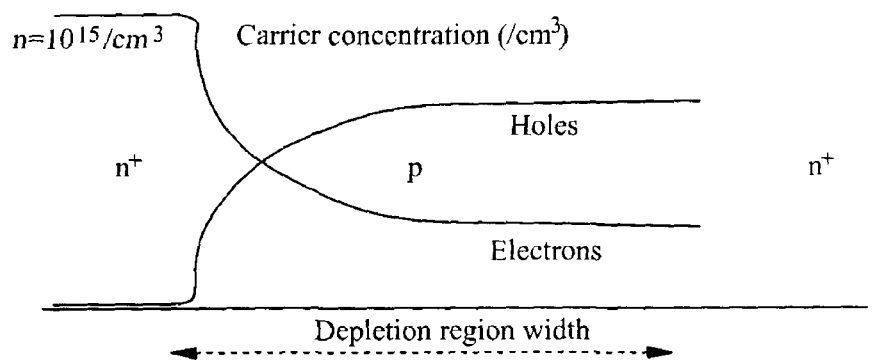
FIG. 9 is a similar diagram in a punch through n+pn+ device in accordance with the invention.

The carrier concentration profile for the conventional n+p junction in avalanche breakdown is shown in FIG. 8 and the carrier concentration profile for the punch through n+pn+ structure is shown in FIG. 9.

The device represented in FIG. 8 has a relatively wide depletion region, high avalanche gain and low electron carrier concentration on the depletion region edge next to the p-region. The carriers to be avalanche multiplied are thermally generated in the p-region, and constitute a small thermally generated leakage current. The avalanche gain must be high to increase this small leakage current to a relatively large reverse avalanche current to generate light.

On the other hand, in the case of the punch through device 10 represented in FIG. 9, the current to be avalanche multiplied is the injection current from the forward biased junction 16, which is much higher than the thermally generated leakage current. In this device the avalanche gain needed should be less to attain the same light generating current, causing the depletion region 20 to be narrower, resulting in shorter transit time of carriers through the device 10 and thus faster switching response. The narrower depletion region 20 may also result in a lower operating voltage, resulting in improved power efficiency of the light generating process.

Also evident from FIG. 9 is the significantly higher carrier concentration of the electrons in the punch through case, which may lead to a higher probability of carrier-phonon and carrier-carrier radiative interactions to occur within the high electric field depletion region, especially if direct radiative carrier (electron-hole) recombination is proportional to the electron/hole carrier concentration pn product.

Another advantage of the punch through device 10 may be that at the point of carrier injection form the forward biased junction 16, i.e. near the forward biased junction, large numbers of "cool" (low energy) electrons are in the same volume region of the depletion region 20 with large numbers of accelerated "hot" (energetic) holes, which will enhance the radiative direct bandgap carrier recombination process.

Figure 10:
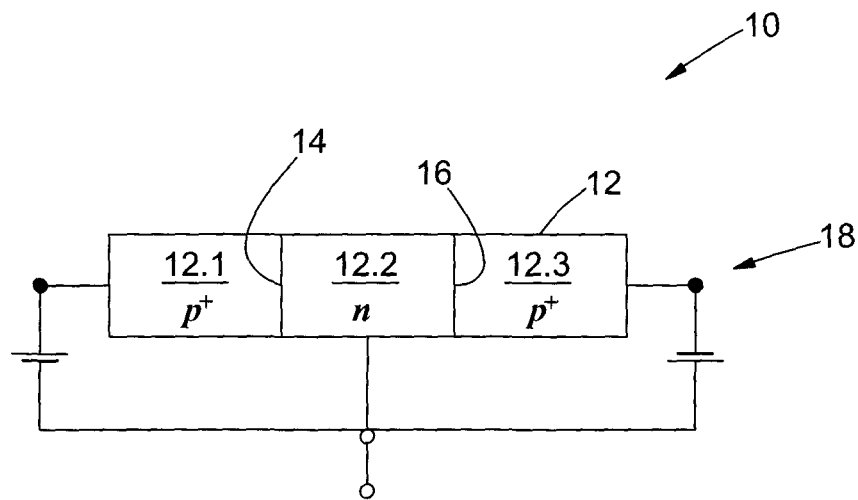
FIG. 10 is a schematic diagram of an alternative embodiment of the device according to the invention.
Figure 11:
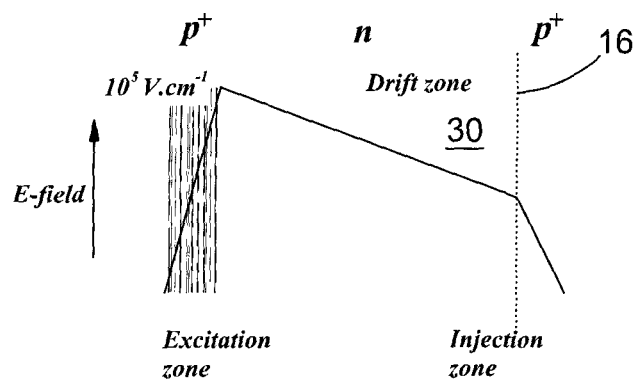
FIG. 11 is a diagram of electrical field strength and distribution of the device in FIG. 10.
Figure 12:
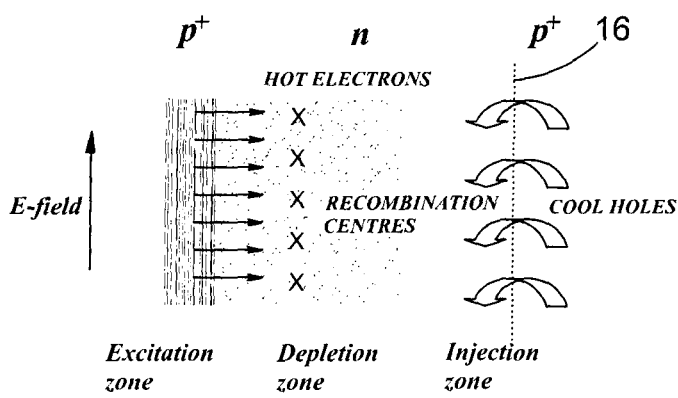
FIG. 12 is an alternative representation of the device in FIG. 10.

In FIG. 10 there is shown a diagrammatic representation of an alternative device according to the invention in the form of a $p^+np^+$ avalanche injection silicon electroluminescent device 10. In FIG. 11, a diagram of electrical field strength and distribution through the device 10 is given. Near a first $p^+n$ junction 14 the electric filed conditions reach high enough magnitudes to allow ionization and multiplication of host atoms. This region is referred to as the excitation zone. Because of the ionization of host atoms in the centre n region, the electric field strength gradually decays until it reaches the second p+n junction 16. The region between the two junctions is referred to as the drift zone 30. The remaining short electric field decay is taken up by ionization of host dopant atoms in the highly doped $p^+$ region 12.3. Because of the specific bias conditions and as illustrated in FIG. 12, a large density of low energy (cool) holes is injected from the second $p^+n$ junction 16, also referred to as the injection zone, into the drift zone 30.

A distribution of both excited high energy electrons is formed at the excitation junction 14. These electrons traverse through the drift zone 30 of the device. During their traverse they may interact with defect centers that may act as recombination or relaxation centers. Since large densities of holes are injected from the injection zone 16 and which travel in a direction opposite to that of the electrons, recombination may occur between high energy drifting electrons and lower energy injected holes in the whole of the drift zone 30.

Figure 13:
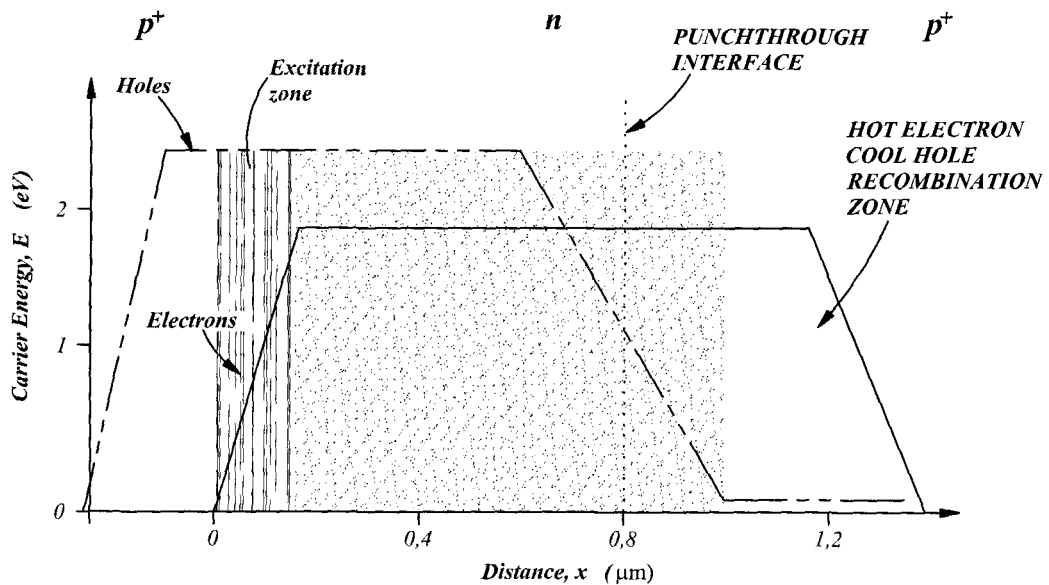
FIG. 13 is a diagrammatic representation of carrier energy against distance for the device in FIG. 10.

Representations of carrier energy for both electrons and holes as they traverse the drift region 30 are shown in FIG. 13. Excited electrons traverse through the drift zone 30 substantially maintaining their maximum ionization energy for host atoms, which is approximately 1.8 eV. The electric field strength is high enough to sustain this energy for the electrons throughout the drift region. When they reach the punch through interface (the interface where the depletion region 20 and injecting junction depletion region meet), it can be assumed that the electrons penetrate the injection zone and even maintain their energy until the end of the injection zone depletion region. Since high energy electrons have an average mean free path length of about 150 nm before losing their energy, most of the electrons will penetrate also the almost neutral $p^+$ region 12.3 of the injection junction. Here they may subsequently interact with a large number of free low energy holes as present in the $p^+$ region 12.3. The holes being injected into the drift zone from the injecting $p^+n$ junction gain energy fast and it is assumed that they gain maximum ionization energy for holes of host silicon of approximately 2.3 eV within 150 to 200 nm. The holes maintain their energy as they traverse the rest of the drift zone 30. Recombination processes between high energy electrons and medium and high energy holes may occur throughout the drift zone, but may have minor implication on the energy and carrier distribution.

Figure 14:
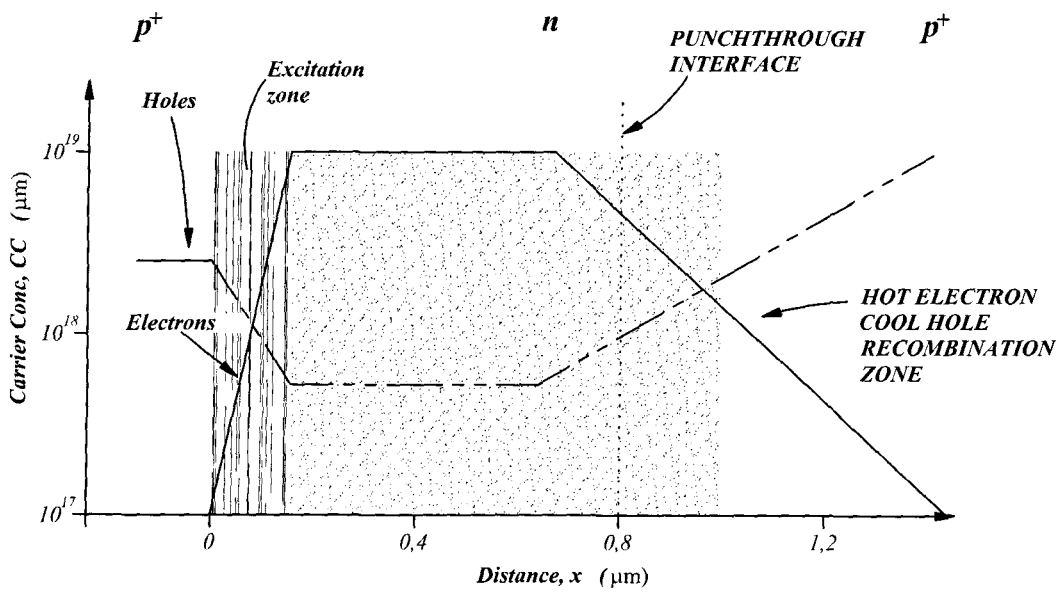
FIG. 14 is a diagram of carrier concentration against distance for the device in FIG. 10.
Figure 15:
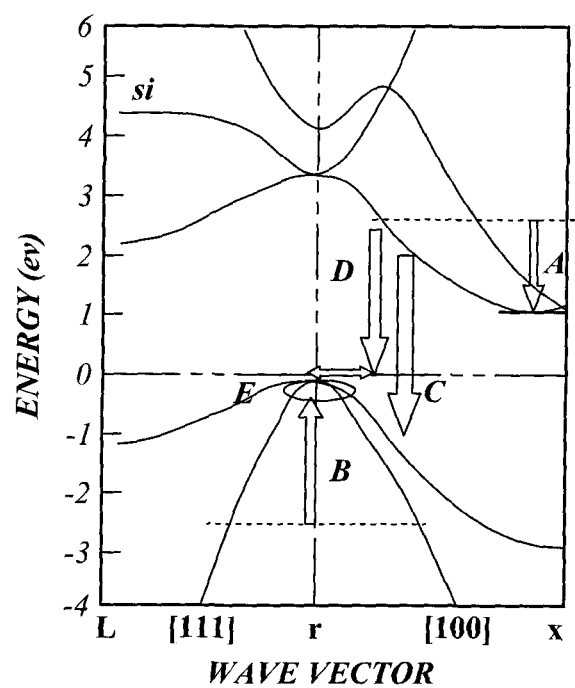
FIG. 15 is a Si band diagram illustrating possible and different photonic energy transitions.

FIG. 14 shows the corresponding projected carrier density profiles for electrons and holes as they traverse the drift zone 30. Because of the high field strength in the drift zone 30, the electrons traverse the zone with high speed (near saturation velocity), without much decrease in carrier density. When they interact and recombine with large densities of injected holes from the injecting junction 16, it can be assumed that their concentration may rapidly decay until all electrons has recombined with holes. This process may occur mainly in the last part of the drift zone 30 and even into the neutral $p^+$ region. Similarly, high densities of low energy holes are injected from the junction 16 and interact with the traversing high energy exiting electrons. It can hence be assumed that the hole concentration rapidly decays from the junction 16 to certain moderate levels. Once in the high electric field drift zone 30, they reach saturation velocity and drift with lesser recombination through the rest of the drift zone. It is presently expected that particularly favorable regions for maximum electroluminescent yield would be near the injection zone 16, where the densities for both traversing high energy electrons as well as injected low energy holes are high. Considering the corresponding projected energies of the carries as represented in FIG. 13, it is presently expected that transitions of type D as represented in FIG. 15 and leading to energy transitions of respectively 2.3 eV and 0.5 eV may occur. Deeper into the drift region 30, transitions of type C of approximately 2.8 to 2.9 eV may occur. Transitions of type A and B may occur in still deeper regions of the drift zone closer to junction 14.

The invention claimed is:

1. A light emitting device comprising:
a body of an indirect bandgap semiconductor material;
a first junction region in the body formed between a first region of the body of a first doping kind and a second region of the body of a second doping kind; and
a second junction region in the body formed between the second region of the body and a third region of the body of the first doping kind;
a terminal arrangement connected to the body that applies a voltage that reverse biases the first junction region into a breakdown mode and that forward biases at least part of the second junction region;
the device being configured so that a first depletion region associated with the reverse biased first junction region punches through the second region to a second depletion region associated with the at least part of the second junction region,
an energy barrier at the at least part of the forward biased second junction region that is lowered by the first depletion region punching through the second region to the second depletion region, and
carriers of a first kind injected into the first junction region from the at least part of the second junction region with the lowered energy barrier to interact with higher energy carriers of a second kind within the first depletion region to thereby enhance light generation in the first depletion region, thereby improving electroluminescence effects in the device.

2. The light emitting device as claimed in claim 1 wherein the at least part of the second junction region is laterally spaced from the first junction region and faces the first junction region and wherein other regions of the second junction region is reverse biased.

3. The light emitting device as claimed in claim 1 wherein the semiconductor material comprises silicon.

4. The light emitting device as claimed in claim 1, wherein the first doping kind is an n-type of conductivity and the second doping kind is a p-type of conductivity.

5. The light emitting device as claimed in claim 1, wherein the first doping kind is a p-type of conductivity and the second doping kind is an n-type of conductivity.

6. The light emitting device as claimed in claim 1, wherein the breakdown mode is one of an avalanche mode, a field emission mode and a combination of avalanche and field emission mode.

7. The light emitting device as claimed in claim 1, wherein the terminal arrangement comprises two terminals, a first terminal being connected to the first region of the body to apply a voltage of a first polarity to the first region and a second terminal being connected to the third region of the body to apply a voltage of an opposite polarity to the third region.

8. The light emitting device as claimed in claim 1, wherein the terminal arrangement comprises three terminals, a first terminal being connected to the first region of the body to apply a voltage of a first polarity to the first region of the body, a second terminal being connected to the third region of the body to apply a voltage of an opposite polarity to the third region and a third terminal being connected to the second region of the body.

9. A method of operating a light emitting device comprising the steps of:
  providing a body of an indirect bandgap semiconductor material having a first junction region formed between a first region of the body of a first doping kind and a second region of the body of a second doping kind and a second junction region formed in the body between the second region of the body and a third region of the body of the first doping kind;
  applying a voltage to reverse bias the first junction region into a breakdown mode, to forward bias at least a first part of the second junction region, and to cause a first depletion region associated with the reverse biased first junction region to punch through the second region of the body to a second depletion region associated with the at least first part of the second junction region, to thereby lower an energy barrier of the at least first part of the second junction region and inject carriers of a first kind from the at least first part of the second junction region into the first junction region to interact with higher energy carriers of a second kind within the first depletion region to thereby enhance light generation in the first depletion region, thereby improving electroluminescence effects in the device.

10. The method as claimed in claim 9 wherein the second junction region is reverse biased and the first part of the second junction region is caused to be forward biased by the punched through first depletion region.

11. A light emitting device comprising:
  a body of an indirect bandgap semiconductor material;
  a punch through structure comprising
    a first junction region in the body formed between a first region of the body of a first doping kind and a second region of the body of a second doping kind; and
    a second junction region in the body formed between the second region of the body and a third region of the body of the first doping kind;
  a terminal arrangement connected to the body that applies a voltage that reverse biases the first junction region to cause a breakdown mode of said first junction region and that forward biases at least part of the second junction region;
  the punch through structure being such that a first depletion region associated with the reverse biased first junction region punches through the second region to a second depletion region associated with the at least part of the second junction region, so that carriers injected into the first junction region in breakdown mode from the at least part of the forward biased second junction region are increased to thereby enhance electroluminescence effects in the device.

* * * * *